(12) United States Patent
Phillips et al.

(10) Patent No.: US 7,713,577 B2
(45) Date of Patent: May 11, 2010

(54) PREPARATION OF GRAPHITIC ARTICLES

(75) Inventors: Jonathan Phillips, Rio Rancho, NM (US); Martin Nemer, Carlsbad, NM (US); John C. Weigle, Santa Fe, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 830 days.

(21) Appl. No.: 11/364,980

(22) Filed: Feb. 28, 2006

(65) Prior Publication Data
US 2006/0198949 A1 Sep. 7, 2006

Related U.S. Application Data

(60) Provisional application No. 60/657,572, filed on Mar. 1, 2005.

(51) Int. Cl.
B05D 5/12 (2006.01)
C01B 31/04 (2006.01)

(52) U.S. Cl. .................. 427/122; 427/115; 423/448
(58) Field of Classification Search .................. None
See application file for complete search history.

(56) References Cited

U.S. PATENT DOCUMENTS

| | | | |
|---|---|---|---|
| 4,262,039 A | | 4/1981 | Gyarmati et al. |
| 5,094,915 A | * | 3/1992 | Subramaniam ............. 428/408 |
| 5,674,572 A | * | 10/1997 | Sarin et al. ................. 427/450 |
| 5,766,766 A | * | 6/1998 | Sasaki et al. ................ 428/408 |
| 5,869,133 A | * | 2/1999 | Anthony et al. .......... 427/249.8 |
| 6,129,901 A | | 10/2000 | Moskovits et al. |
| 6,203,505 B1 | | 3/2001 | Jalisi et al. |
| 6,569,107 B2 | | 5/2003 | Jalisi et al. |
| 6,843,919 B2 | | 1/2005 | Klabunde et al. |
| 6,887,451 B2 | | 5/2005 | Dodelet et al. |
| 6,984,888 B2 | | 1/2006 | Sung et al. |
| 6,998,103 B1 | * | 2/2006 | Phillips et al. ............ 423/447.3 |
| 7,309,446 B1 | * | 12/2007 | Kley ............................. 216/11 |
| 2002/0054849 A1 | * | 5/2002 | Baker et al. .............. 423/447.2 |
| 2002/0061441 A1 | * | 5/2002 | Ogura et al. .............. 429/218.1 |
| 2002/0076614 A1 | * | 6/2002 | Yoon et al. .............. 429/231.95 |
| 2002/0112814 A1 | * | 8/2002 | Hafner et al. ............. 156/272.2 |
| 2002/0172767 A1 | * | 11/2002 | Grigorian et al. ....... 427/255.28 |
| 2003/0094035 A1 | * | 5/2003 | Mitchell ....................... 73/105 |
| 2003/0108479 A1 | * | 6/2003 | Baker et al. .............. 423/447.3 |
| 2003/0118727 A1 | | 6/2003 | Ting et al. |

(Continued)

FOREIGN PATENT DOCUMENTS

EP  1 096 533 B1  1/2006

OTHER PUBLICATIONS

Novoselov et al., "Electric Field Effect in Atomically Thin Carbon Films," Science, vol. 306, Oct. 2004, pp. 666-699.

(Continued)

*Primary Examiner*—Timothy H Meeks
*Assistant Examiner*—Joseph Miller, Jr.
(74) *Attorney, Agent, or Firm*—Samuel L. Borkowsky

(57) ABSTRACT

Graphitic structures have been prepared by exposing templates (metal, metal-coated ceramic, graphite, for example) to a gaseous mixture that includes hydrocarbons and oxygen. When the template is metal, subsequent acid treatment removes the metal to yield monoliths, hollow graphitic structures, and other products. The shapes of the coated and hollow graphitic structures mimic the shapes of the templates.

28 Claims, 14 Drawing Sheets

U.S. PATENT DOCUMENTS

| | | | | |
|---|---|---|---|---|
| 2003/0189114 A1* | 10/2003 | Taylor et al. | | 239/602 |
| 2004/0022719 A1* | 2/2004 | Beguin et al. | | 423/447.3 |
| 2004/0131858 A1* | 7/2004 | Burden et al. | | 428/408 |
| 2005/0106093 A1* | 5/2005 | Iijima et al. | | 423/447.1 |
| 2008/0193763 A1* | 8/2008 | Hunt et al. | | 428/403 |
| 2008/0299307 A1* | 12/2008 | Ward et al. | | 427/249.1 |
| 2009/0068470 A1* | 3/2009 | Choi et al. | | 428/403 |

OTHER PUBLICATIONS

Qui et al., "Preparation of Carbon-Coated Magnetic Iron Nanoparticles from Composite Rods Made from Coal and Iron Powders," Fuel Processing Technology, vol. 86, 2004, pp. 267-274.

Baughman et al., "Carbon Nanotubes—The Route Toward Applications," Science, vol. 297, Aug. 2002, pp. 787-792.

Ma et al., "Very High Surface Area Microporous Carbon with a Three-Dimensional Nano-Array Structure: Synthesis and Its Molecular Structure," Chem. Mater., vol. 13, Dec. 2001, pp. 4413-4415.

Huang et al., "Directed Assembly of One-Dimensional Nanostructures into Functional Networks," Science, vol. 291, Jan. 2001, pp. 630-633.

Klett et al., "High Thermal-Conductivity, Mesophase-Pitch-Derived Carbon Foams: Effect of Precursor on Structure and Properties," Carbon, vol. 38, Jun. 2000, 953-973.

Park et al., "Catalytic Behavior of Graphite Nanofiber Supported Nickel Particles. 3. The Effect of Chemical Blocking on the Performance of the System," J. Phys. Chem. B, vol. 103, Mar. 1999, pp. 2453-2459.

Inagaki et al., "Preparation of Carbon-Coated Transition Metal Particles From Mixtures of Metal Oxide and Polyvinylchloride," Carbon, vol. 37, Feb. 1999, pp. 329-334.

Che et al., "Chemical Vapor Deposition Based Synthesis of Carbon Nanotubes and Nanofibers Using a Template Method," Chem. Mater., vol. 10, Jan. 1998, pp. 260-267.

Kyotani et al., "Formation of Platinum Nanorods and Nanoparticles in Uniform Carbon Nanotubes Prepared by a Template Carbonization Method," Chem. Commun. Apr. 1997, pp. 701-702.

Kyotani et al., "Formation of New Type of Porous Carbon by Carbonization in Zeolite Nanochannels," Chem. Mater., vol. 9, Feb. 1997, pp. 609-615.

Wei et al., "Thermal and Catalytic Etching—Mechanisms of Metal Catalyst Reconstruction", Advances in Catalysis, vol. 41, 1996, pp. 359-421.

Kyotani et al., "Formation of Ultrafine Carbon Tubes by Using an Anodic Aluminum Oxide Film as a Template," Chem. Mater., vol. 7, No. 8, Aug. 1995, pp. 1427-1428.

Parthasarathy et al., "Template Synthesis of Graphitic Nanotubules," vol. 7, No. 11, Nov. 1995, pp. 896-897.

Saito et al., "Cobalt Particles Wrapped in Graphitic Carbon Prepared by an Arc Discharge Method," J. Appl. Phys., vol. 75, No. 1, Jan. 1994, pp. 134-137.

Aref'eva et al., Formation of Pyrocarbon From Methane and Acetylene at Temperatures of 1350-1500° C, vol. 22, No. 3, May 1986, pp. 326-330.

Wu et al., "Catalytic Etching of Platinum During Ethylene Oxidation," J. Phys. Chem., vol. 89, No. 4, 1985, pp. 591-600.

Frenklach et al., "Soot Formation in Shock-Tube Oxidation of Hydrocarbons," Twentieth Symposium (International) on Combustion, pp. 871-878, The Combustion Institute, Pittsburgh 1984.

Oya et al., "Review Phenomena of Catalytic Graphitization," J. of Mat. Sci, vol. 17, 1982, pp. 309-322.

Westbrook et al., "A Comprehensive Mechanism for the Pyrolysis and Oxidation of Ethlene," Nineteenth Symposium (International) on Combustion, pp. 153-166, The Combustion Institute, Pittsburg 1982.

Warnatz, The Structure of Laminar Alkane-, Alkene-, and Acetylene Flames, Eighteenth Symposium (International) on Combustion, pp. 369-384, The Combustion Institute, Pittsburgh 1981.

Baker et al., "Filamentous Carbon Formation over Iron Surfaces," A.C.S. Symposium Series, vol. 202, 1981, pp. 1-21.

Baker et al., "The Formation of Filamentous Carbon," Chemistry and Physics of Carbon, vol. 14, pp. 83-165, 1978.

Rostrup-Nielsen, "Mechanisms of Carbon Formation of Nickel-Containing Catalysts," J. of Catalysis, vol. 48, 1977, pp. 155-165.

Baker et al., "Nucleation and Growth of Carbon Deposits from the Nickel Catalyzed Decomposition of Acetylene," J. of Catalysis, vol. 26, 1972, pp. 51-62.

Brooks et al., "The Formation of Some Graphitizing Carbons," Chemistry and Physics of Carbon, vol. 4, 1968, pp. 243-286.

Lenher, "The Reaction Between Oxygen and Ethylene. II" J. Am. Chem. Soc. vol. 53, Oct. 1931, pp. 3752-3765.

Y. Fernandez, et al., "Graphitic encapsulation of micron- and nano-sized Ni particles using ethylene as precursor," Appl. Surf. Sci. (Jul. 2009), doi: 10.1016/j.apsusc.2009.07.110.

J. Phillips, et al., "Graphitic Structures by Design," Langmuir, vol. 22, No. 23 (Oct. 2006) pp. 9694-9703.

J. Phillips, et al., "Structure and Kinetics of Formation and Decomposition of Corrosion Layers Formed on Lithium Compounds Exposed to Atmospheric Gases," International Materials Reviews, vol. 50, No. 5 (Oct. 2005) pp. 265-286.

* cited by examiner

SIDE VIEW: Designed Graphite "Heat Spreader"

STEP 1: Etch column pattern, micron scale in silicon. Standard technology

STEP 2: Coat columns selectively with select metal. (May require two steps to insure bond.)

STEP 3: Grow graphite — Our technology! Oriented to maximize heat transfer.

STEP 4: Attach to si-chip with complete I.C.

PREPARATION OF GRAPHITIC ARTICLES

RELATED CASES

We claim the benefit of U.S. Provisional Patent Application Ser. No. 60/657,572 filed Mar. 1, 2005, hereby incorporated by reference.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to graphitic articles and more particularly to the preparation of graphitic articles by coating a metal template or an existing graphitic article with graphite. A coated metal article can be converted into a hollow graphitic article by dissolving away the metal template.

BACKGROUND OF THE INVENTION

Graphitic articles employed for commercial applications are currently made by cutting or shaping macroscopic graphitic bodies using machine tools or by high pressure molding of graphite powders. There are problems with these approaches. First, the scale and intricacy of the design of graphitic articles by a machining or high pressure molding approach is limited. Graphitic articles with micron-scale dimensions and smaller cannot readily be prepared by machining techniques or high pressure molding approaches. Graphitic articles in which the orientation of the planes of graphite is critical (an array of cylindrical objects in which the basal planes of the graphite encircle the cylinder axis, for example) also cannot be fabricated readily using machining techniques. In addition, fabrication is expensive because machine work is required and the graphite feedstock is costly. Naturally occurring graphite feedstock is sometimes used. More often, the feedstock is produced by an expensive batch process that requires soaking carbon precursors such as petroleum coke for hours at temperatures in excess of 2500 K.

There remains a need for methods for preparing intricate graphitic articles.

Therefore, an object of the invention is to provide a simple method for producing precise and intricate graphitic articles.

Yet another object of the invention is to provide a method for producing precise and intricate graphite coatings on metallic, ceramic, and metal-coated objects.

Another object of the invention is to provide a method for preparing graphite monoliths.

Yet another object of the invention is to provide a method for making very large (scales from centimeters to many meters) graphitic objects.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, the present invention includes a method for preparing a graphitic article. The method involves exposing a metal template to a gaseous mixture comprising hydrocarbon and oxygen; heating the template and the gaseous mixture to a temperature chosen to at least partially combust some of the hydrocarbon, whereby graphite is deposited on the metal template; and thereafter dissolving away the metal.

The invention also includes method for preparing a graphite-coated article. The method involves putting a metal template into a container; sending a gaseous mixture comprising hydrocarbon and oxygen into the container; and heating the template to a temperature chosen to at least partially combust some of the hydrocarbon, whereby graphite is deposited on the metal template.

The invention also includes a coating method that involves exposing an article having a surface that is partially or entirely graphite to a gaseous mixture comprising hydrocarbon and oxygen; heating the article and the gaseous mixture to a temperature chosen to at least partially combust some of the hydrocarbon, whereby graphite is deposited on graphite portion of the surface.

BRIEF DESCRIPTION OF THE DRAWINGS

The accompanying drawings, which are incorporated in and form a part of the specification, illustrate the embodiment (s) of the present invention and, together with the description, serve to explain the principles of the invention. In the drawings.

DETAILED DESCRIPTION

The present invention relates to the preparation of two- and three-dimensional graphitic articles. The articles are produced rapidly and inexpensively using metal templates and a gaseous hydrocarbon/oxygen mixture. Metal templates are coated with graphitic carbon by heating the templates while exposing them to the gaseous hydrocarbon/oxygen mixture. The term hydrocarbon is meant to include hydrocarbons such as alkanes (propane and butane, for example), alkenes (ethylene, propylene, butylenes, for example), alkynes (propyne, for example), and also partially oxidized hydrocarbons such as alcohols (methanol, ethanol, for example), aldehydes, ethers (dimethyl ether, diethyl ether, methyl t-butyl ether, for example), and ketones (acetone, for example). The gaseous mixture is typically a fuel rich mixture, wherein the term fuel rich is meant to indicate that the amount of oxygen in the hydrocarbon/oxygen mixture is not sufficient for complete combustion of the hydrocarbon. A nonexclusive list of metal templates includes metal foams, lattices, patterned arrays, thin films, wires, powders, and monoliths.

Figure 1:
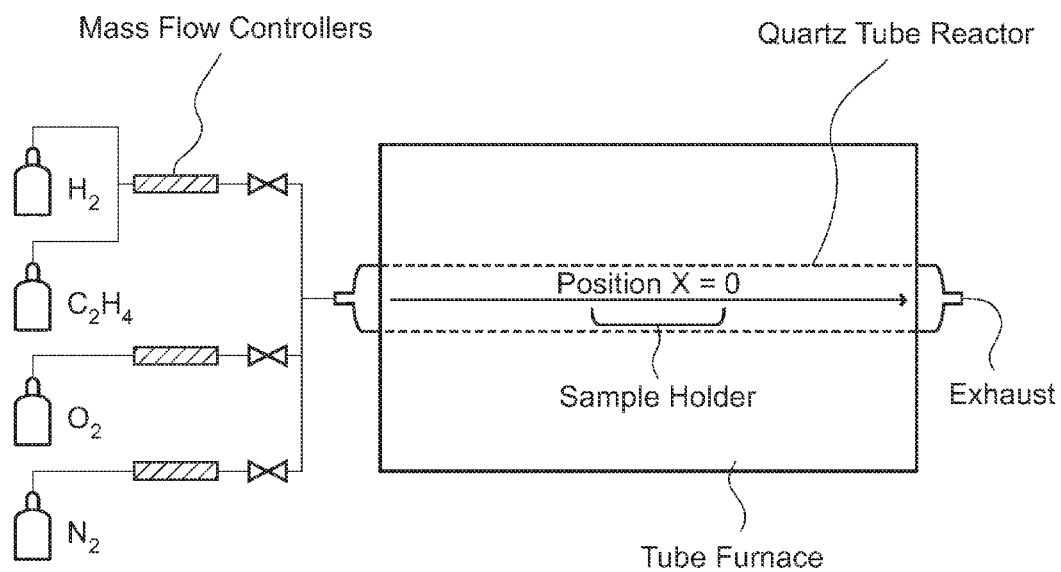
FIG. 1 shows a schematic representation of an embodiment apparatus used in preparing a graphitic article according to the present invention.

According to one aspect of the method, one or more metal templates are put into a container, typically a furnace, and preferably a tube furnace. The template is heated to a temperature sufficiently high (about 500 degrees Celsius or lower to about 700 degrees Celsius or higher) to partially combust a gaseous mixture of oxygen and hydrocarbon. For reasons of safety, it is preferred that the gaseous mixture includes an inert gas such as nitrogen or helium. Preferably, the major component is inert gas. After putting the template into the container, it is heated and exposed to the gaseous mixture as shown in FIG. 1. While not intending to be bound by any particular explanation, it is believed that as the gas contacts the template (or the gas layer that surrounds the template), a partial combustion reaction occurs that results in the formation of carbon-containing radicals, which are involved in the formation of the graphite coating on the template. The graphite coating grows rapidly (e.g. 1 layer/second). A variety of factors may have an impact on the growth rate, such as the temperature of the template, the composition of the gaseous mixture, and other factors. A layer of graphite appropriate for preparing nanostructures, for example, should take only seconds to produce. After depositing a desired thickness of graphite on the template, the gas is removed. The result is a graphite-coated metal article. The graphite-coated article can be used without further modification. It can also be modified by, for example, removing the metal template. The metal template can be removed by exposing the graphite-coated article to acid. The acid dissolves away the metal template, leaving a graphitic article (hollow in some cases) having a surface shaped like the surface of the original metal template.

It should be understood that any metal or alloy that can be coated with graphite may be used with the invention. For the preparation of graphitic articles, preferably the metal used to form the template is one that can be dissolved without difficulty by treatment with acid. A non-limiting list of metals that can be used as template materials includes nickel, platinum, cobalt, palladium, and rhodium. Alloys of these and other materials can also be used.

One aspect of the present invention is related to the amount of template material needed for preparing graphite-coated articles. It should also be understood that the invention is not limited by the amount of material used for the template, and that very small, or thin (a thin film, for example) templates could be used. In addition, graphite may be deposited on templates that are substantially non-metallic but coated with a thin layer (one or two atomic layers, for example) of metal.

Another aspect of the present invention relates to the production of graphitic articles having a well-defined structure. This is an important aspect because the structure of the graphitic article mimics the structure of the template. Thus, a graphitic article having practically any shape and any size may be prepared using this invention by forming a graphitic coating on the appropriate metal template or metal-coated template. Graphite-coated articles, hollow graphitic articles, and graphitic articles having complex and precise shapes may be prepared this way.

The invention has been demonstrated using metal powder (both micron-sized and nanosized) as well as monolithic metallic templates. Graphitic articles having any shape and size (long graphitic tubes such as carbon nanotubes, for example) could be prepared using this invention if the appropriate metal template is available.

Having generally described the present invention, the following EXAMPLES illustrate in more detail the preparation of graphite-coated metal powder and hollow graphitic particles prepared from the graphite-coated metal powder.

Example 1

Preparation of graphite-coated metal powder. A sample of nickel powder less than about 250 milligrams and composed of irregularly shaped, micron scale particles was placed in an open ceramic container having dimensions of about 4 cm in height by 1 cm in width by 1 cm in depth. The container was then placed into a quartz tube about 3 cm in diameter by 0.7 cm in length. The tube was placed in a tube furnace about 25 cm in length. The nickel powder was exposed to a gaseous mixture of helium and hydrogen by sending a flow of helium at a flow rate of about 150 ml/min and a flow of hydrogen at a flow rate of about 20 ml/minute through the quartz tube and into the tube furnace. The temperature inside the tube furnace was raised to about 350 degrees Celsius and held at that temperature for about one hour.

Afterward, the sample was exposed to pure helium and the temperature of the furnace was raised to about 600 degrees Celsius.

After less than about 10 minutes, the sample was exposed to a gaseous mixture of about 88 percent helium, about 3 percent oxygen, and about 9 percent ethylene ($C_2H_4$). The total flow rate of this gaseous mixture was about 170 ml (STP)/min. These conditions were maintained for about one hour.

Afterward, the sample was exposed to a flowing gas mixture of helium at a flow rate of about 150 ml/min and hydrogen at a flow rate of about 20 ml/min for about one hour.

After the hour, the sample was exposed to a flow of pure helium at a flow rate of about 150 ml/min at a temperature of about 600 degrees Celsius for about 15 hours.

Afterward, and while maintaining the flow rate of helium, the furnace was cooled gradually to room temperature.

Under these conditions, the graphite coated the metal particle templates evenly, and the radial rate (i.e. in the direction normal to the template surface) of graphite formation is roughly linear and of the order of about 0.1 microns/hour.

The product was removed and examined by Scanning Electron Microscopy (SEM). Scanning electron microscopic images of the product were consistent with the product being graphite-coated nickel powder.

Example 2

Preparation of hollow graphitic particles. About 75 milligrams of the product of EXAMPLE 1 was added to about 10 milliliters of an acid solution prepared by mixing together concentrated nitric acid (FISCHER) and concentrated hydrochloric acid in a ratio of about 4:1. After about 12 hours, the acid solution was removed by vacuum filtration using submicron filter paper. The residue that remained on the filter paper was washed with water and dried in the air. The residue was examined using scanning electron microscopy, transmission electron microscopy, energy dispersive analysis, and x-ray diffraction.

Figure 2A:
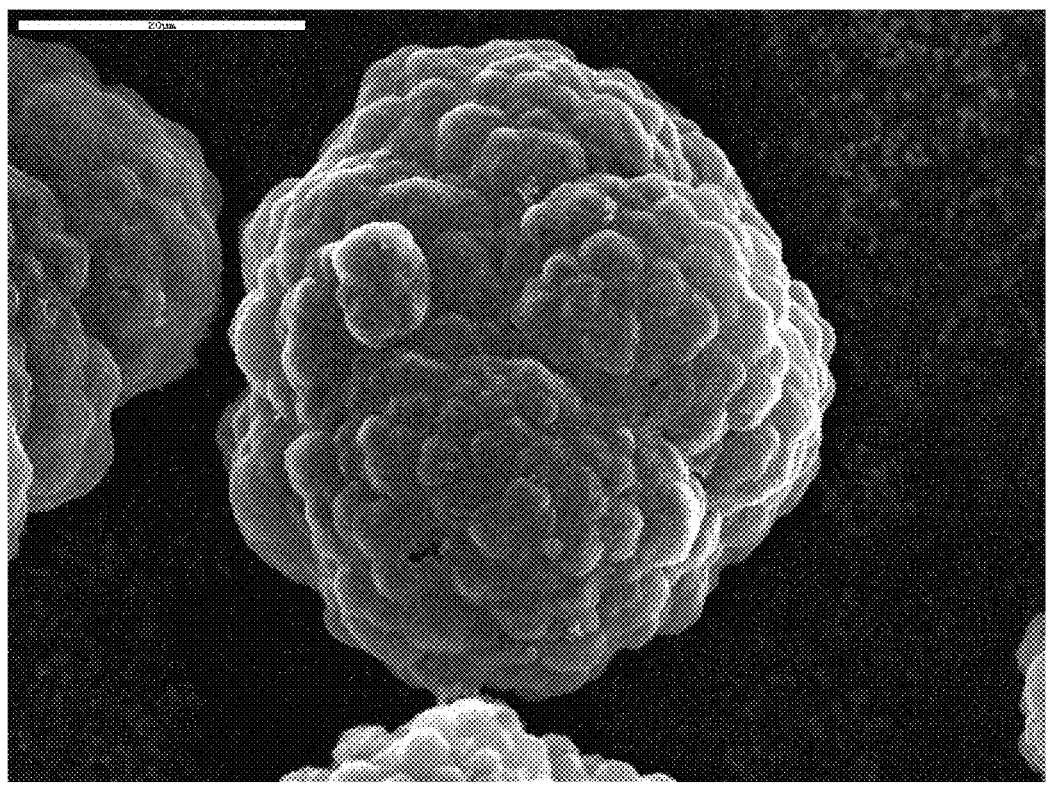
FIG. 2a shows a Scanning Electron Microscopy (SEM) image of a hollow graphitic particle prepared according to the present invention.

FIG. 2a shows a Scanning Electron Microscopy (SEM) image of a product particle. The image confirms that the shape of the particles formed by dissolving away the metal template mimic the shapes of the original powder particles.

Figure 2B:
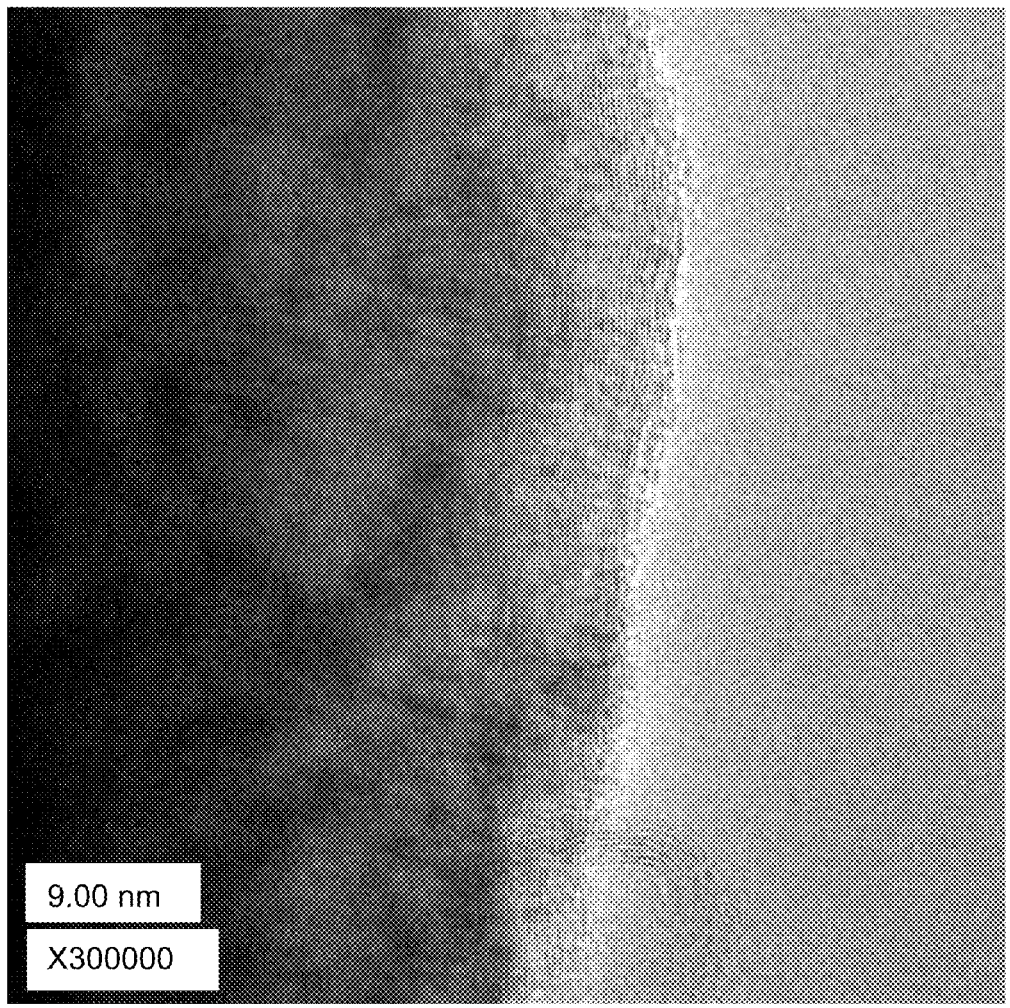
FIG. 2b shows a Transmission Electron Microscopy (TEM) image of cross-section of a hollow graphitic particle. The basal planes of graphite are visible in the image.

FIG. 2b shows a Transmission Electron Microscopy (TEM) image of a cross-section of a hollow particle. The spacings between the basal planes are consistent with graphite.

Figure 2C:
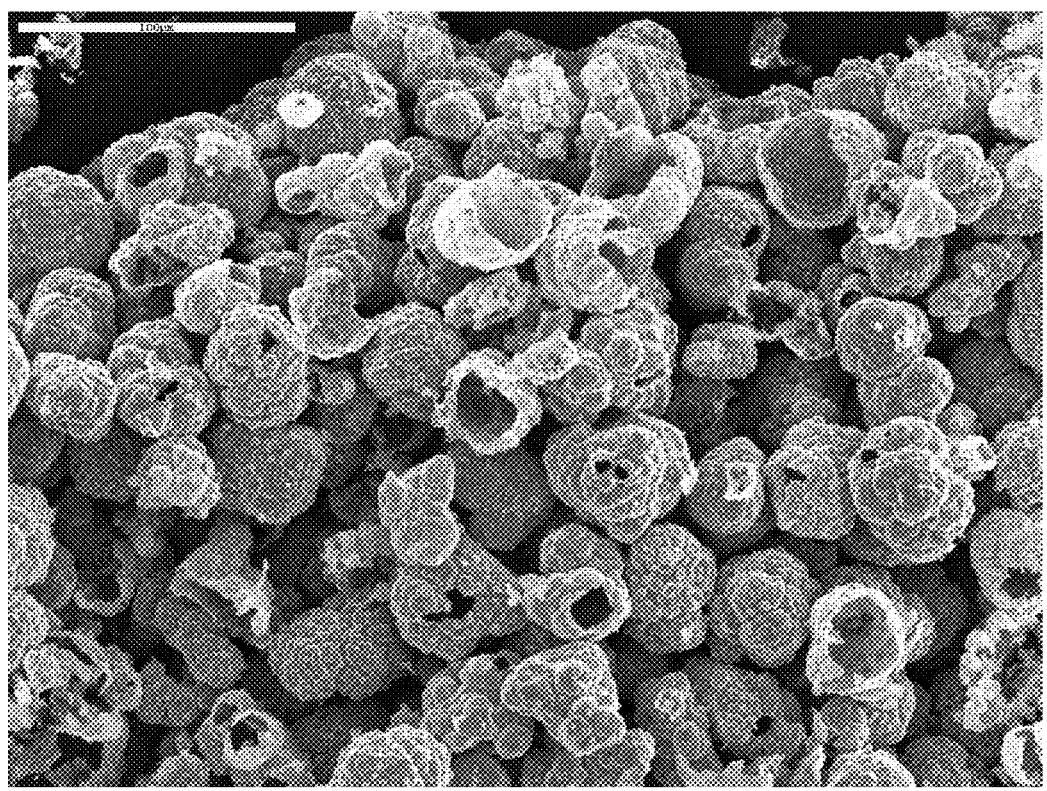
FIG. 2c shows an SEM image of hollow particles generated by exposing nickel powder to an ethylene/oxygen mixture at a temperature of about 600 degrees Celsius for about 1 hour, followed by acid treatment to remove the nickel. The morphology of these particles very closely mimics that of the original nickel particle templates.

FIG. 2c shows an SEM image of the hollow particles after some treatment using a mortar and pestle. As the image shows, some of the broken particles are hollow, indicating that the acid treatment dissolved away the metal template.

Figure 2D:
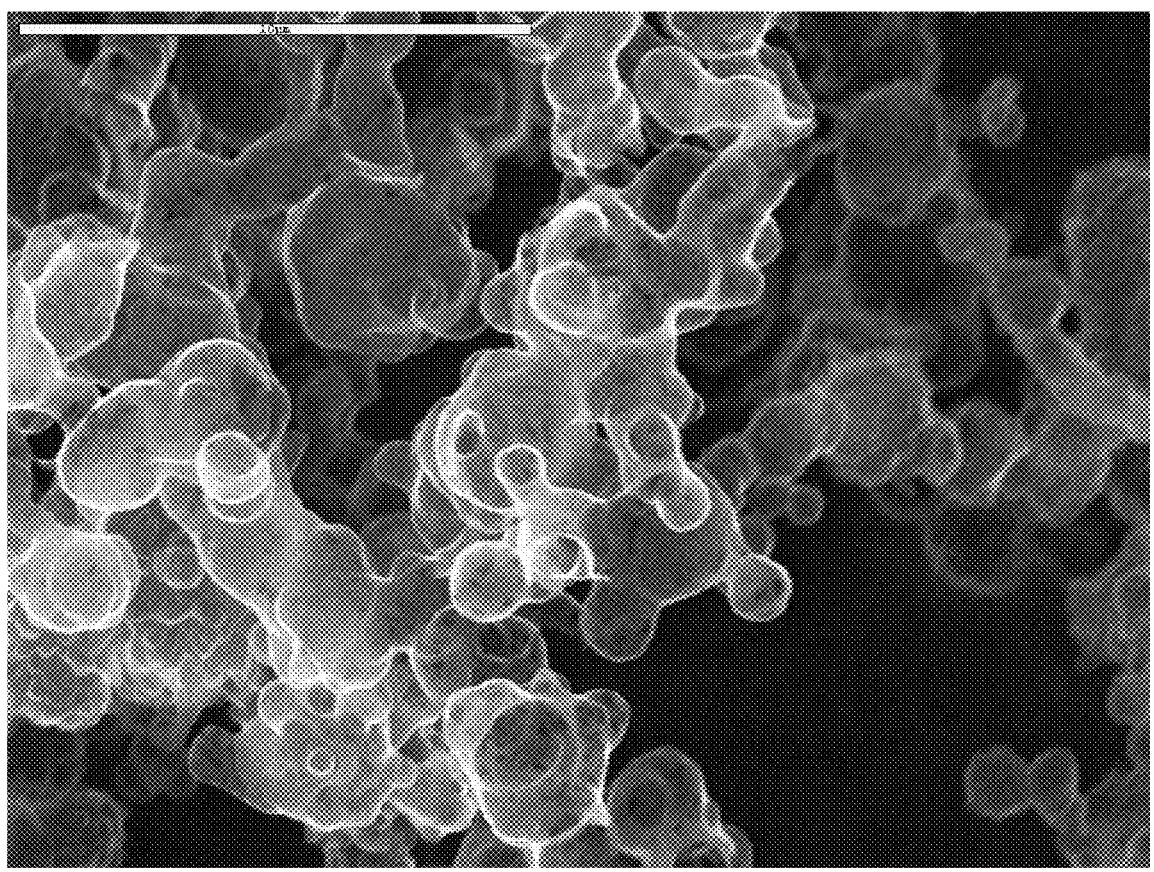
FIG. 2d shows an SEM image of hollow particles generated by exposing nickel powder to an ethylene/oxygen mixture at a temperature of about 600 degrees Celsius for about 10 minutes. The morphology of these particles very closely mimics that of the original nickel particle templates.

FIG. 2d shows an SEM image of hollow particles prepared according to EXAMPLE 1 and EXAMPLE 2 with the exception that the nickel powder was exposed to the ethylene/oxygen mixture for about 10 minutes instead of an hour. Surprisingly, no evidence of damage, which might have been expected to take place during the removal of the metal template, was observed. A comparison of the thicknesses of the particles prepared using a 10 minute exposure versus a one hour exposure to the reactive ethylene/oxygen gas mixture appears to indicate that the increase in the thickness of the graphite coating that forms is approximately linear with the time of exposure to the gas mixture. For the conditions employed above, for example, the graphite thickness increases at a rate of about 0.7 micron/hr.

The removal of the metal template was also confirmed by energy dispersive analysis (EDAX) and x-ray diffraction. While the EDAX signal due to nickel was the dominant signal for the graphite coated metal particles, virtually no EDAX signal due to nickel was observed after the acid treatment. Similarly, no metal was detected by XRD after the acid treatment. Only sharp diffraction lines consistent with a graphite structure were found. No evidence of other forms of carbon, such as turbostratic carbon, were detected.

The high thermal conductivity of graphite makes it an attractive material for use as filler in foam and solid materials. Hollow graphitic particles may have an order of magnitude greater compression strength and thermal conductivity than the carbonized microparticles currently available.

Example 3

Preparation of graphite-coated mesh article. A graphite coated mesh article was prepared according to the procedure described in EXAMPLE 1, the only difference being that the template used was nickel mesh instead of nickel powder particles.

Example 4

Figure 3A:
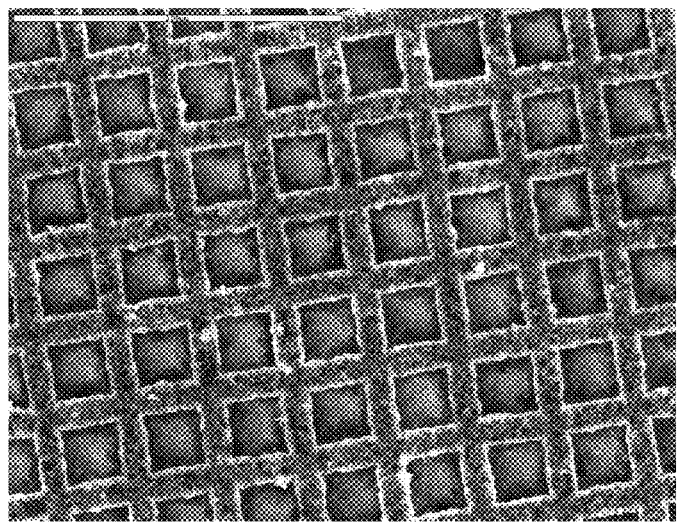
FIGS. 3a, 3b, and 3c show SEM images at increasing magnification of a hollow graphitic mesh article prepared by treating a nickel mesh template with a gas mixture of ethylene/oxygen followed by dissolving away the template.
Figure 3B:
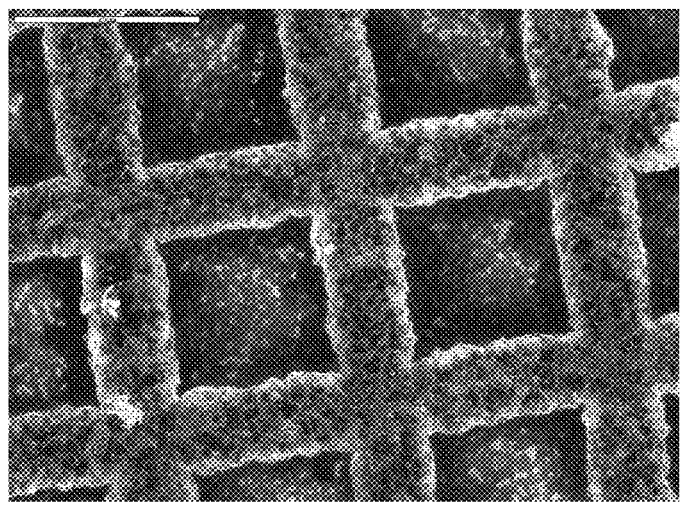
Figure 3C:
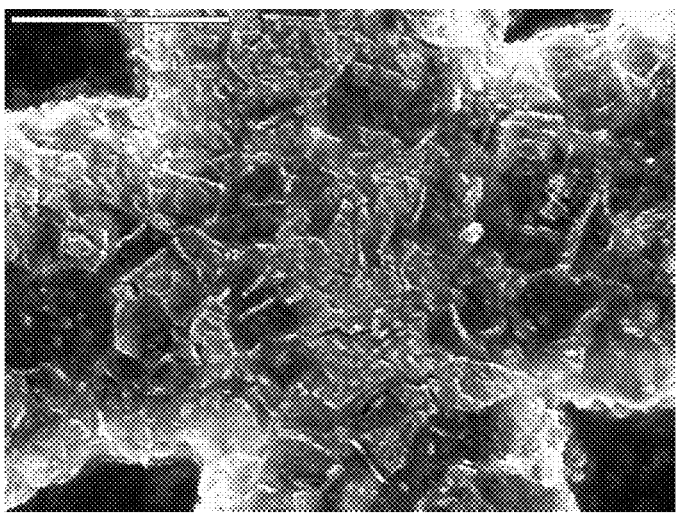

Preparation of hollow graphitic mesh article. A hollow graphitic mesh structure was prepared by treating the graphite-coated nickel mesh article prepared according to EXAMPLE 3 with an acid solution prepared from a 4:1 mixture of nitric acid and hydrochloric acid, respectively. FIGS. 3a, 3b, and 3c show, at increasing magnification, the hollow graphitic mesh article that remains following acid removal of the original nickel template. As FIGS. 3a, 3b, and 3c show, the hollow article formed after dissolving away the nickel mesh template mimics the shape of the template.

Figure 4:
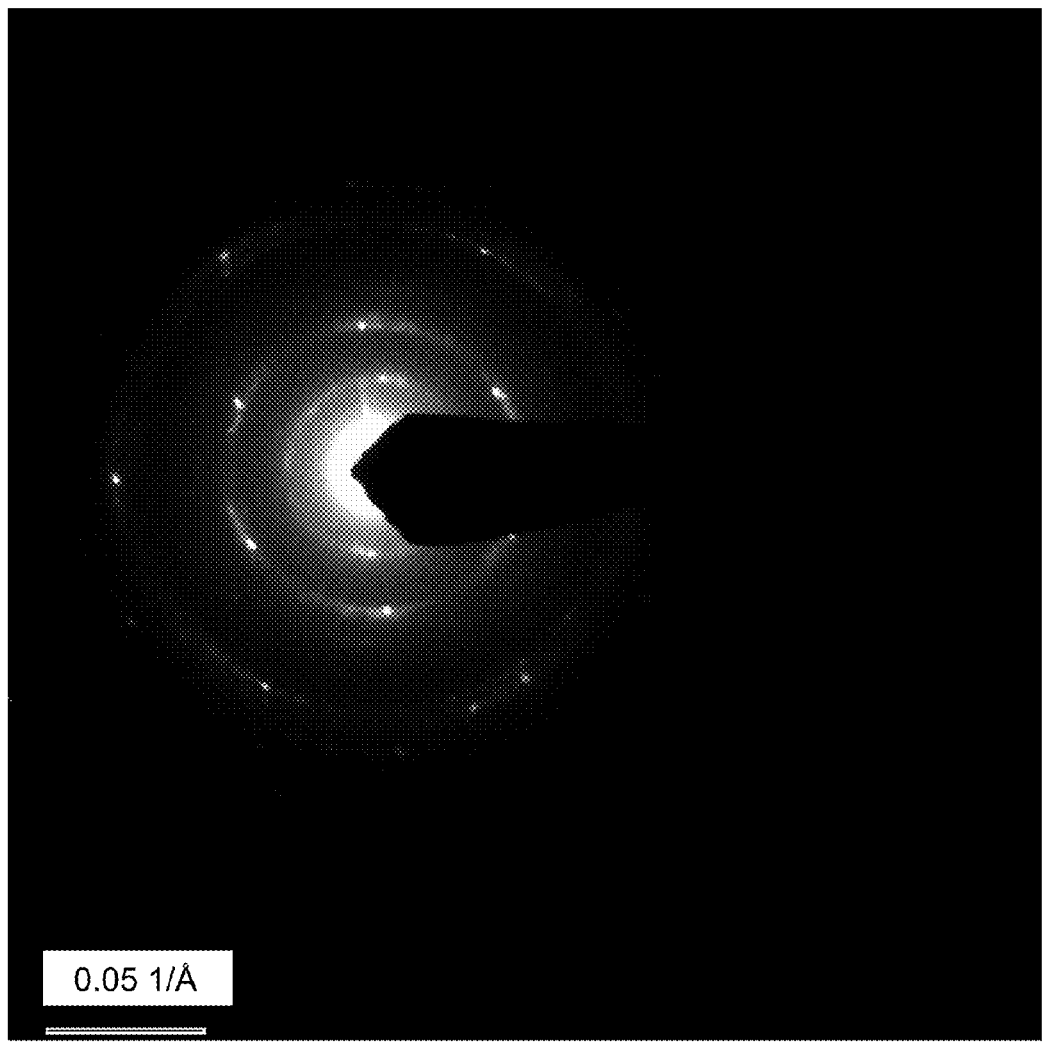
FIG. 4 shows a selected area diffraction image of the article shown in FIG. 2c.

The graphitic nature of the hollow article can clearly be seen in FIG. 4, which is a selected area diffraction image of the hollow article. The ring and point patterns of the image are those expected for graphite.

Example 5

Preparation of spherical graphite coated metal nanoparticles. Spherical graphite coated metal nanoparticles were prepared according to the procedure of EXAMPLE 1, with the exception that substantially spherical-shaped nickel powder particles having a diameter of about 200 nanometers were used instead of irregularly shaped micron scale particles.

Figure 6:
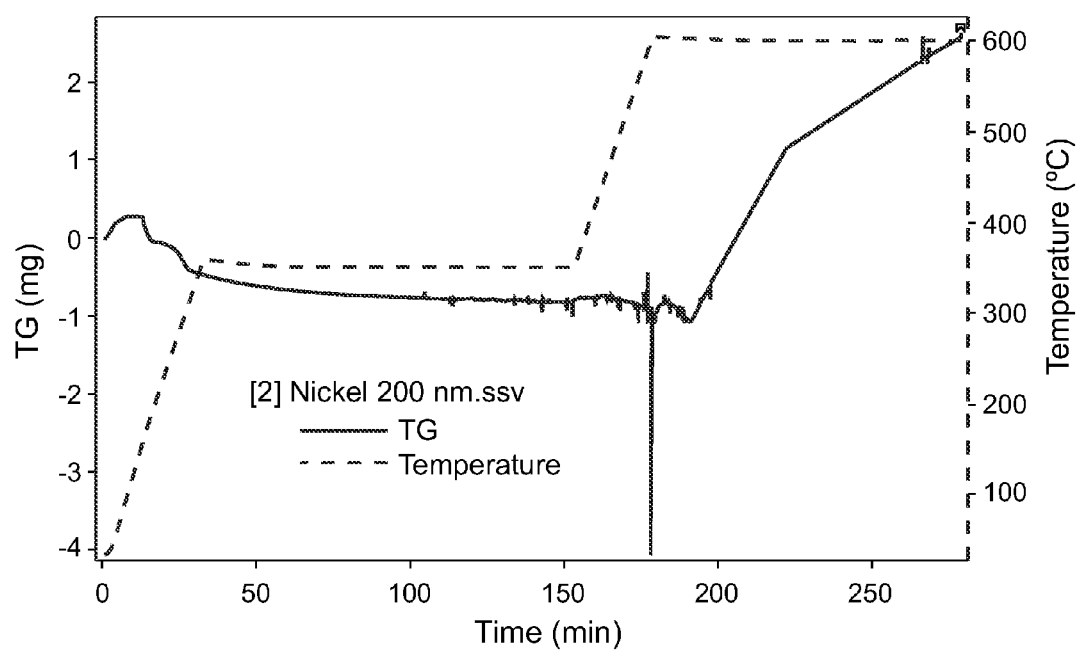
FIG. 6 shows a thermal gravimetric analysis plot illustrating the change in weight of a sample of nickel powder over time as the powder is heated and coated with graphite according to the method of the present invention.

The rate of graphite formation was measured using a thermal gravimetric analyzer. FIG. 6 shows a thermal gravimetric analysis (TGA) plot illustrating the change in weight of a sample of spherical nickel nanoparticles versus time as the powder is heated and coated with graphite. The rate of graphite formation was measured using a DSC-TGA instrument (NETZSCH, Model # STA 409 PC LUXX®). Spherical nickel nanoparticles (210 mg, obtained from UMICORE) were loaded under ambient atmosphere in a small (ca. 1 cm$^3$ capacity) alumina vessel designed for the instrument. The vessel was placed in the instrument and the sample was then treated in different gas mixtures and temperatures according to the following programmed sequence.

The sample was first treated in a flowing (ca. 100 cc/min) gas mixture of argon (90 volume %) and hydrogen. The temperature was raised from 25 degrees to about 350 degrees as this gas mixture was passed over the sample over a period of 32 minutes. The temperature was held at 350 degrees Celsius for an additional 2 hours. As FIG. 6 shows, the sample lost weight during this step, presumably due to the removal of absorbed water (T<150 degrees Celsius), and the reduction of surface nickel oxide to metallic nickel (T>300 degrees Celsius). By contrast, in a control run in which no sample present, there was no significant weight change for this step for the control experiment, which was carried out in the same manner with the exception that no nickel was present in the alumina vessel.

Next, the temperature was raised to 600 degrees Celsius at a rate of 10 degrees Celsius per minute under a nitrogen atmosphere to flush the hydrogen gas from the system and equilibrate the sample at the graphite deposition temperature. As FIG. 6 shows, this increase in temperature is accompanied by a small change in weight. The small change in weight is believed to be due to buoyancy changes that are expected as the gas composition changes.

When the temperature reached 600 degrees Celsius, the sample was exposed to a flowing gas mixture of argon (90%), ethylene (3.3%) and oxygen (6.7%) while the temperature was maintained at 600 C for 100 minutes. As FIG. 6 shows, after a brief induction period, there was a constant rate of weight change for more than an hour. After about 40 minutes, an abrupt change in the weight of the sample was observed, after which the weight continued to increase linearly with a small decrease in the rate. Under essentially the same conditions, only a very small weight change was observed in the control experiment where no nickel was present.

Examination of the product using a light microscope at low magnification revealed a porous agglomeration of graphite-coated particles.

Example 6

Figure 5:
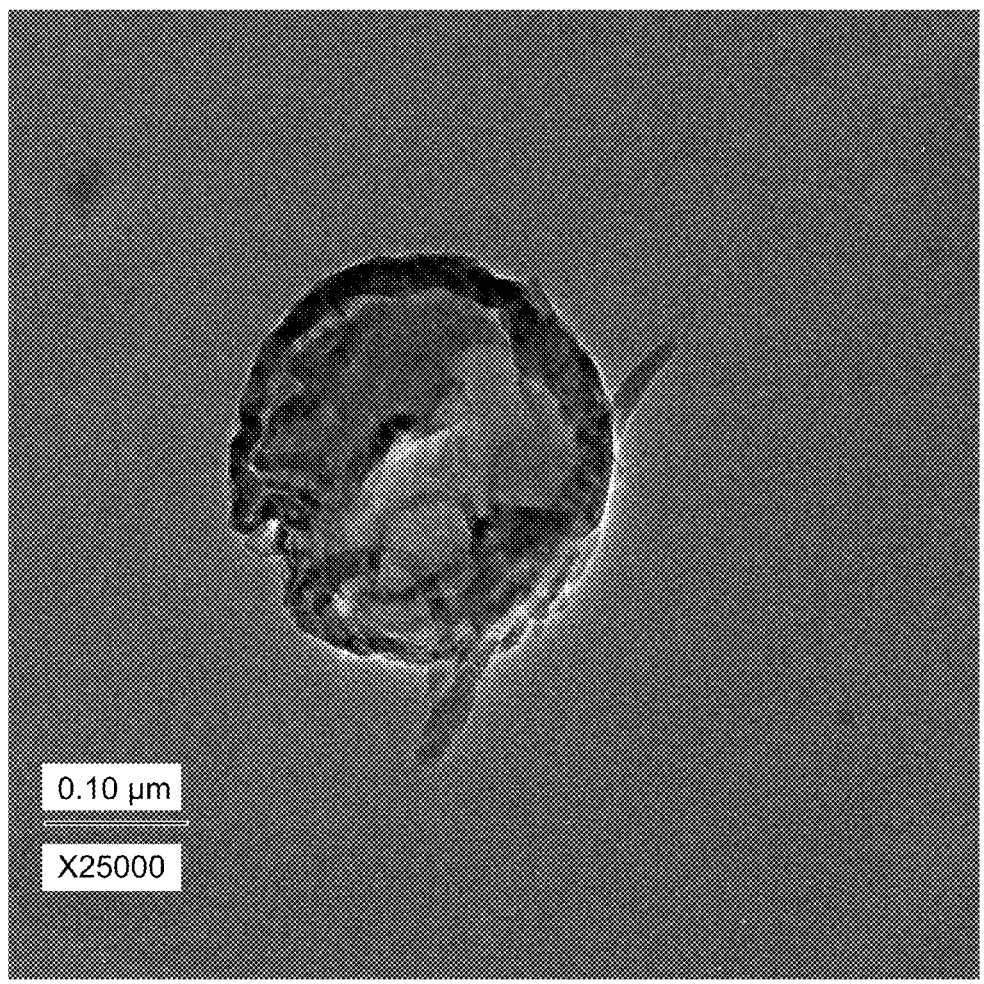
FIG. 5 shows a TEM image of hollow, substantially spherical graphitic particle.

Preparation of hollow spherical graphitic particles. Hollow spherical graphitic particles were prepared from the graphite-coated particles of EXAMPLE 5. The procedure for dissolving away the metal was the same as for EXAMPLE 2, with the exception that the exposure time to the ethylene/oxygen gas mixture was about ten minutes instead of an hour. FIG. 5 shows a TEM image of a particle after acid treatment. The image clearly shows that the particle is a hollow, substantially spherical, nanoparticle. The identification of the wall material as graphite is supported by high magnification images of the wall, which show basal planes with the correct spacing for graphite, and by images produced by selected area diffraction of a large group of these hollow particles that show the rings expected for graphite.

Example 7

Figure 7:
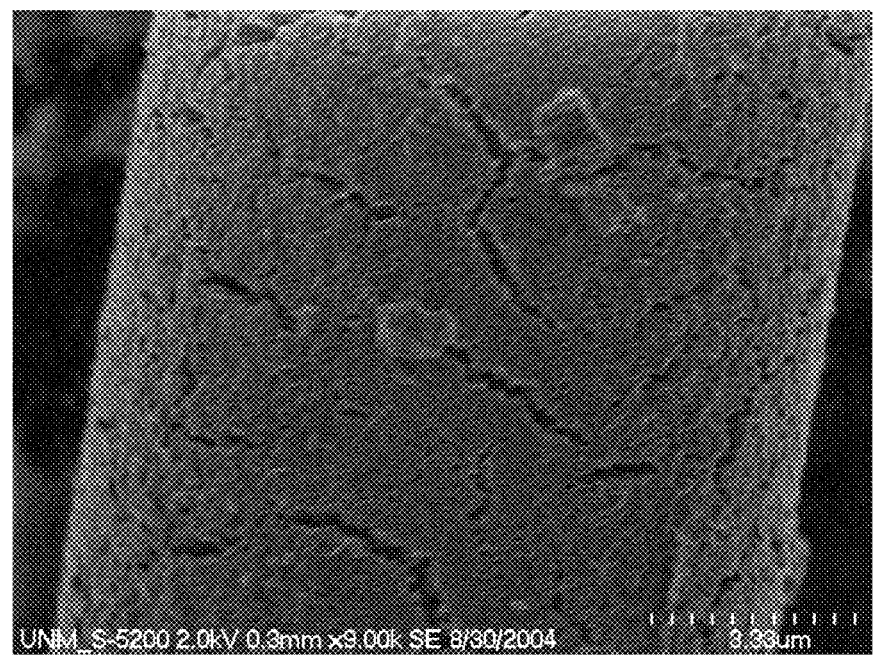
FIG. 7 shows an image of a graphite-coated fiber prepared according to the present invention.
Figure 8:
FIG. 8 shows another image of a graphite-coated fiber. From this image, the thickness of the graphite coating can be estimated at slightly less than about 1 micron.

Preparation of graphite-on-metal-coated ceramic. After forming a thin layer of nickel (0.1 microns in thickness) on fibers of silica using a standard wet-chemistry process, the metal-coated fibers were coated with graphite according to the procedure described in EXAMPLE 1. FIG. 7 and FIG. 8 show images of the product. From the image of the coated fiber shown in FIG. 8, the thickness of the graphite coating may be estimated at almost 1 micron.

Example 8

Figure 9:
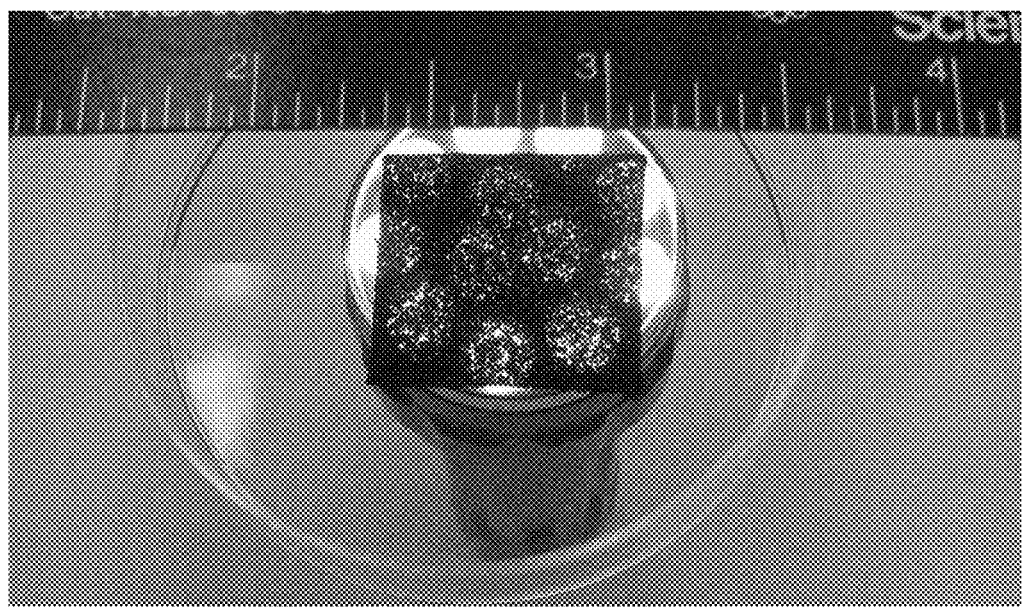
FIG. 9 shows an image of graphite foam prepared according to the present invention.

Preparation of microcellular graphite foam. A graphite foam with a micron scale microstructure was prepared according EXAMPLE 4, the only difference being that a piece of nickel foam having approximate dimensions of ¾ inch by ¾ inch by ⅛ inch was used as the template rather than a nickel lattice. An image of the graphite foam was taken with a camera after removing the nickel foam template (see FIG. 9). The image shows the graphite foam and a small flashlight underneath. The flashlight is turned on. As FIG. 9 shows, the graphite foam is translucent to the light from the flashlight.

Microcellular graphitic foam is a rigid material typically with an open cell structure. It is used for thermal management and as an ultra-lightweight high strength filler material for composites. The continuous phase of the foam is solid graphite. The bulk thermal conductivity of currently available graphitic foam is much greater than that of solid copper (see J. Klett, R. Hardy, E. Romine, C. Walls and T. Burchell, "High-Thermal-Conductivity, Mesophase-Pitch-Derived Carbon Foams: Effect of Precursor on Structure and Properties," Carbon, vol. 38, pp. 953-973, (2000)). Additionally, the heat-transfer of graphitic foam is isotropic, in contrast to composite materials of polymer filled with graphite fibers. Currently, only open-cell solid foams with pore sizes of 100 microns have been produced. These open-cell solid foams are currently produced by blowing mesophase pitch. This blowing process requires heating to 2800 degrees Celsius to graphitize the structure. By contrast, using the present invention, low-density closed-cell graphitic foam may be prepared at far lower temperatures (600 degrees Celsius and lower) than those required for preparing the open-cell foams.

The following EXAMPLE demonstrates that the invention may be used for preparing a graphitic article from a graphite template. A metal template was not used with this EXAMPLE.

Example 9

Figure 10:
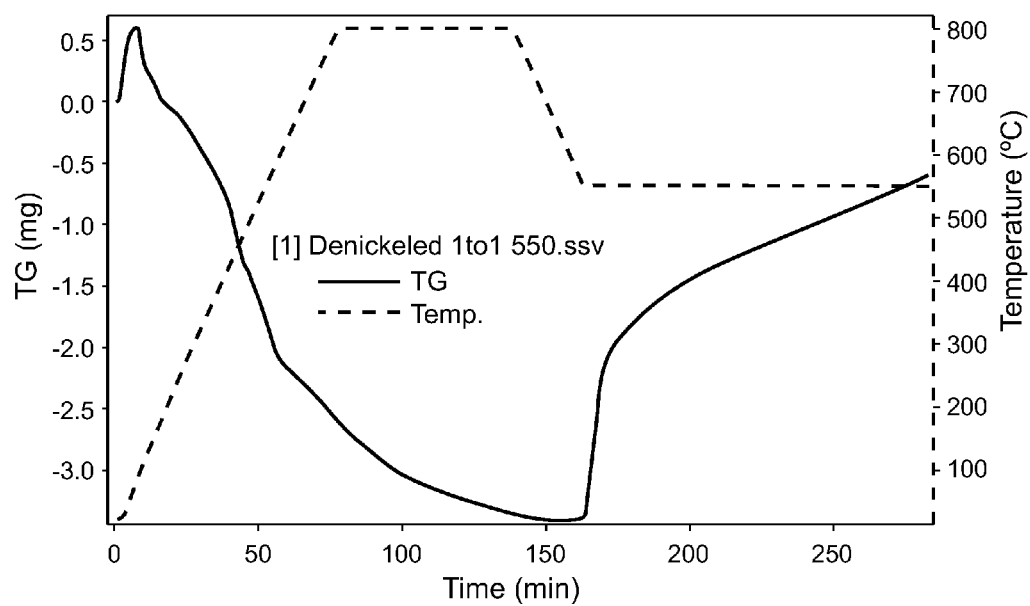
FIG. 10 shows a plot of weight versus temperature and time for graphite particles prepared on a graphite (no metal) substrate according to the present invention.

Preparation of graphitic article. In this EXAMPLE, graphite nanoparticles were placed in a fuel rich, gas phase, combustion environment. About 52 mg of pure 'nano graphite' (average diameter approx. 200 nm) particles were placed in the sample holder of a NETZSCH thermogravimetric analyzer-differential scanning calorimeter (TGA-DSC) instrument. FIG. 10 shows a plot of weight versus temperature and time. The particles were heated to a temperature of 800 degrees Celsius in an hour in a mixture of flowing $H_2$ (6%)/$N_2$. After reaching 800 degrees Celsius, heating was continued at that temperature in the flowing gas mixture for about one hour. Afterward, the system was cooled over approximately 15 minutes in an atmosphere of flowing nitrogen to a temperature of about 550 degrees Celsius. Afterward, the flowing gas was changed to a gas mixture of about 90% $N_2$, 6.33% $O_2$ and 3.66% $C_2H_4$ for approximately two hours.

The steps that involved heating to 800 degrees and maintaining the temperature of 800 degrees for about an hour resulted in significant weight loss (see FIG. 10). It is believed that this heating under hydrogen results in removal of oxygen from the surface of graphite, which is accompanied by significant weight loss. As oxygen is removed, unsaturated edge carbon sites are created on the graphite.

During the first cool down period to a temperature of about 550 degrees Celsius, with no hydrogen present in the flowing gas, the weight of the graphite was unchanged, likely because nitrogen does not effect the removal of surface groups from graphite except at very high temperatures (>900 degrees Celsius).

Subsequent exposure to the ethylene/oxygen atmosphere resulted in rapid weight gain due to the formation of graphite.

Analysis of the product by X-ray diffraction revealed only graphite. No turbostratic carbon was present.

The invention can be used to prepare graphite coated wires and graphitic tubes (such as carbon nanotubes) and structures that incorporate graphitic tubes. Carbon nanotubes have a unique strength to weight ratio. It has been suggested, for example, that carbon nanotubes be woven into ropes for space elevators, and that they be used as current emitters in display and lighting applications because of their molecular size and ability to carry high currents without degrading. They have also been proposed as elements in molecular scale transistors. While preliminary investigations indicate that a molecular scale transistor using carbon nanotubes is feasible (see, for example, R. H. Baughman, A. A. Zakhidov and W. A. de Heer, "Carbon Nanotubes—the Route Toward Applications," Science, vol. 297, pp. 787-792 (2002)), the organization of the appropriate types of nanotubes into complex two-dimensional networks has been a daunting task. The preparation of these types of structures using this invention becomes straightforward once the appropriate metal template has been prepared. Once a metal template that incorporates nanowire elements has been prepared, the template may then be coated with graphite according to the invention. After dissolving away the template, the nanotube elements of the resulting graphitic article could be tested as molecular scale circuit elements (see R. H. Baughman, A. A. Zakhidov and W. A. de Heer, "Carbon Nanotubes—the Route Toward Applications," Science, vol. 297, pp. 787-792 (2002); and Y. Huang, X. Duan, Q. Wei and C. M. Leiber, "Directed Assembly of One-Dimensional Nanostructures into Functional Networks," Science, vol. 291, pp. 630-633 (2001)). This aspect of the invention is particularly attractive because many applications that have been proposed for graphitic nanotubes are difficult to implement in practice. By contract, using this invention, graphite tubes are easily prepared by first coating a wire with a layer of graphite and then dissolving away, or otherwise removing, the metal.

Recently, it has been reported that two-dimensional (less than about 1 nanometer in thickness) flat pieces of graphite served as elements in a logic circuit. The present invention can be used to prepare these types of two-dimensional graphitic articles by depositing graphite on the appropriate nanoscale metallic arrays.

The present invention also overcomes some of the current limitations for producing long graphitic tubes (long carbon nanotubes, for example) because the size and diameter of any graphitic tube produced according to this invention is limited only by the ability to produce the corresponding metal wire.

The invention can be used to prepare simple (hollow spherical and unidirectional) structures, and more complex three-dimensional structures. Metal articles can be coated using the invention, and the metal can be removed using acid treatment for the production of hollow graphitic articles. Articles produced according to the invention may be used, for example, for applications in which a high strength-to-weight ratio is important (e.g. for aerospace applications). The invention may be used to prepare, for example, reinforcing graphite mats to be incorporated into structural elements (e.g. polymeric parts) for aerospace transportation and protective armor-related applications. Filament structures prepared according to the invention may be useful for electrical lighting applications.

Graphite-coated metal articles offer protection from corrosion in some environments.

The invention can be used to replace metal with graphite as a conductor in various components of integrated circuits. Graphite could replace metal, for example, for the internal wiring of integrated circuits, and also for the interconnects (also known in the art as "bumps") between the integrated circuits and the underlying circuit board.

Figure 11:
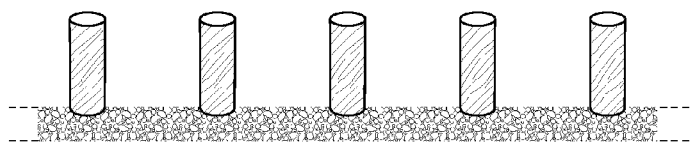
FIG. 11 shows a scheme for preparing an integrated circuit heat spreader according to the present invention. The heat spreader includes an array of graphite columns.
Figure 11:
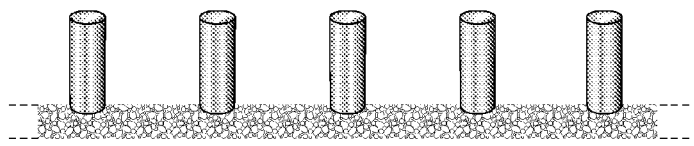
Figure 11:
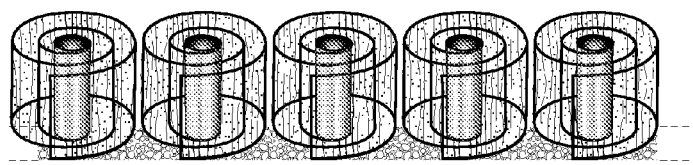
Figure 11:
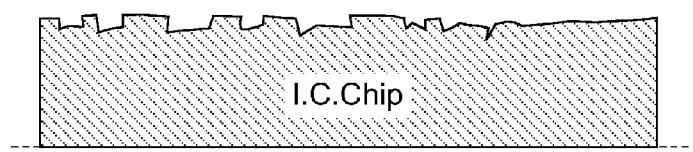

The invention can be used to coat ceramic materials. A 'heat spreader', for example, can be prepared this way using this invention. Heat spreaders are used to remove heat from high performance computer chips. The current generation of CPU chips runs with clock speeds of more than two GHz, and are only able to reach those speeds with sophisticated thermal management systems, including heat spreaders. A heat spreader may be prepared using this invention by first etching an array of ceramic protrusions on a crystalline silicon substrate using well known etching techniques commonly employed in the semiconductor industry. The array is then coated with nickel (or with multiple layers of metal and metal oxide) using plating techniques commonly used in the semiconductor industry (often requiring multi-metal deposition to prevent delamination), and then coating the surface with graphite using the present invention. A flow diagram illustrating an exemplary procedure for preparing a heat spreader is shown in FIG. 11.

The invention can also be used to make very large (many meters) graphitic objects of controlled geometry (e.g. EXAMPLE 3 and EXAMPLE 4) that can be used in all applications for which high strength to weight ratios, and in some cases particular shapes, are required. Applications include parts of bicycles, airplanes, rockets, satellites, cars, ships, etc.

In summary, the present invention provides a simple and straightforward method for preparing graphite-coated articles, hollow graphitic articles and graphitic monoliths. A non-limiting list of articles include heat spreaders, emitter arrays, foams, lighting filaments, nanoparticles, micron sized particles, lattices for batteries, lattices for fuel cell electrodes, particles for break pads, patterned arrays of conductors for an integrated circuit, and logic circuits that include nanoscale graphitic elements. Thus, articles prepared according to the invention may have a wide range of sizes (from the nanoscale and up) and may have any shape provided that the appropriate template can be produced. It is believed that the method of the invention is a faster, more efficient, and less expensive method for preparing graphitic articles, such as graphitic monoliths, than present methods.

The foregoing description of the invention has been presented for purposes of illustration and description and is not intended to be exhaustive or to limit the invention to the precise form disclosed, and obviously many modifications and variations are possible in light of the above teaching.

The embodiment(s) were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for preparing a hollow graphitic article that consists essentially of graphite from a metal template, the graphitic article having a shape that mimics the metal template's shape, comprising:

using a furnace to heat a metal template and a gaseous mixture comprising hydrocarbon and oxygen and inert gas inside the furnace to a temperature chosen to at least partially combust some of the hydrocarbon, wherein the oxygen is present in an insufficient amount to fully combust all of the hydrocarbon, the metal template having a shape, whereby graphite is deposited on the heated metal template, and thereafter dissolving away the metal template, thereby forming a hollow graphitic article consisting essentially of graphite, the graphitic article having a shape that mimics the shape of the metal template.

2. The method of claim 1, wherein the metal template is selected from the group consisting of foams, lattices, patterned arrays, thin films, wires, powders, and monoliths.

3. The method of claim 1, wherein exposing the metal template to the gaseous mixture takes place inside a container that is inside the furnace.

4. The method of claim 3, wherein the furnace comprises a tube furnace.

5. The method of claim 1, wherein the hydrocarbon comprises ethylene.

6. The method of claim 5, wherein the ratio of the amount of oxygen to ethylene is less than about 3.

7. The method of claim 5, wherein the temperature is in the range of from about 400 degrees Celsius to about 800 degrees Celsius.

8. The method of claim 5, wherein the temperature is in the range of from about 500 degrees to about 700 degrees Celsius.

9. The method of claim 1, wherein the metal template comprises nickel, cobalt, platinum, palladium, rhodium, ruthenium, or alloys thereof.

10. The method of claim 9, wherein the metal template comprises a metal-coated substrate.

11. The method of claim 10, wherein the metal and substrate are both dissolved after graphite deposition.

12. The method of claim 1, wherein the step of dissolving away the metal results in the production of a hollow graphitic article.

13. The method of claim 12, wherein the graphitic article comprises a monolith, a heat spreader, a reinforcing graphite mat, an emitter array, foam, a lighting filament, nanoparticles, micron sized particles, a lattice for a battery, a lattice for a fuel cell electrode, particles for brake pads, a patterned array of conductors for an integrated circuit, or a logic circuit comprising nanoscale graphitic elements.

14. A method for preparing a hollow graphitic article from a metal template, comprising:

heating a metal template and a gaseous mixture in a furnace, the metal template having a shape, the gaseous mixture comprising a hydrocarbon and oxygen to a temperature wherein at least some of the hydrocarbon partially combusts, wherein the oxygen is present in an insufficient amount to fully combust all of the hydrocarbon, whereby the metal template becomes coated evenly by graphite; and thereafter dissolving away the metal template to form a hollow graphitic article that consists essentially of graphite and has a shape that mimics the shape of the metal template.

15. The method of claim 14, wherein the metal template is selected from the group consisting of foams, lattices, patterned arrays, thin films, wires, powders, and monoliths.

16. The method of claim 14, wherein exposing the metal template to the gaseous mixture takes place inside a container.

17. The method of claim 14, wherein the furnace comprises a tube furnace.

18. The method of claim 14, wherein the hydrocarbon comprises ethylene.

19. The method of claim 18, wherein the ratio of the amount of oxygen to ethylene is less than about 3.

20. The method of claim 19, wherein the temperature is in the range of from about 400 degrees Celsius to about 800 degrees Celsius.

21. The method of claim 19, wherein the temperature is in the range of from about 500 degrees to about 700 degrees Celsius.

22. The method of claim 14, wherein the metal template comprises nickel, cobalt, platinum, palladium, rhodium, ruthenium, or alloys thereof.

23. The method of claim 14, wherein the metal template comprises a metal-coated substrate.

24. The method of claim 23, wherein the metal and the substrate are both dissolved after graphite deposition.

25. The method of claim 14, wherein the step of dissolving away the metal results in the production of a hollow graphitic article.

26. The method of claim 14, wherein the graphitic article comprises a monolith, a heat spreader, a reinforcing graphite mat, an emitter array, foam, a lighting filament, nanoparticles, micron sized particles, a lattice for a battery, a lattice for a fuel cell electrode, particles for brake pads, a patterned array of conductors for an integrated circuit, or a logic circuit comprising nanoscale graphitic elements.

27. The method of claim 14, wherein when the metal template becomes coated evenly by graphite, it becomes evenly encapsulated by the graphite.

28. The method of claim 14, wherein the gaseous mixture further comprises an inert gas.

* * * * *